(12) United States Patent
Wang et al.

(10) Patent No.: US 11,991,436 B2
(45) Date of Patent: May 21, 2024

(54) DRIVING MECHANISM

(71) Applicant: TDK TAIWAN CORP., Taoyuan (TW)

(72) Inventors: Chao-Hsi Wang, Taoyuan (TW); Yu-Chi Kuo, Taoyuan (TW); Xuan-Huan Su, Taoyuan (TW); Yueh-Lin Lee, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 0 days.

(21) Appl. No.: 17/895,503

(22) Filed: Aug. 25, 2022

(65) Prior Publication Data

US 2023/0063101 A1    Mar. 2, 2023

Related U.S. Application Data

(60) Provisional application No. 63/236,861, filed on Aug. 25, 2021.

(51) Int. Cl.
| | |
|---|---|
| *H04N 23/57* | (2023.01) |
| *G02B 7/04* | (2021.01) |
| *G03B 9/36* | (2021.01) |
| *H04N 23/51* | (2023.01) |
| *H04N 23/54* | (2023.01) |
| *H04N 23/55* | (2023.01) |
| *H10N 30/20* | (2023.01) |

(52) U.S. Cl.
CPC .............. *H04N 23/57* (2023.01); *G02B 7/04* (2013.01); *G03B 9/36* (2013.01); *H04N 23/51* (2023.01); *H04N 23/54* (2023.01); *H04N 23/55* (2023.01); *H10N 30/20* (2023.02)

(58) Field of Classification Search
CPC ........ G03B 9/36; G03B 11/043; H04N 23/57; H04N 23/51; H04N 23/54; H04N 23/55; H10N 30/20; G02B 7/04
See application file for complete search history.

(56) References Cited

U.S. PATENT DOCUMENTS

| | | | |
|---|---|---|---|
| 2020/0249415 A1* | 8/2020 | Wang | G03B 30/00 |
| 2021/0149272 A1* | 5/2021 | Li | H04N 23/55 |
| 2022/0120997 A1* | 4/2022 | Wang | G03B 5/02 |
| 2022/0236626 A1* | 7/2022 | Lin | H01F 7/20 |
| 2022/0334294 A1* | 10/2022 | Wang | G02B 5/005 |
| 2023/0043065 A1* | 2/2023 | Wang | G03B 9/36 |
| 2023/0071345 A1* | 3/2023 | Wu | G03B 11/043 |

* cited by examiner

*Primary Examiner* — Clayton E. LaBalle
*Assistant Examiner* — Diana Hancock
(74) *Attorney, Agent, or Firm* — MUNCY, GEISSLER, OLDS & LOWE, PC

(57) ABSTRACT

A driving mechanism is provided, including a base, a movable unit, and a movable part. The movable unit is movably disposed on the base and connected to an optical element. The movable part is movably disposed on the base and forms a passage. When the movable part moves from the first position to the second position relative to the base, the movable unit can slide relative to the base from its initial position through the passage to a closed position.

18 Claims, 10 Drawing Sheets

DRIVING MECHANISM

CROSS REFERENCE TO RELATED APPLICATIONS

This application claims the benefit of U.S. Provisional Application No. 63/236,861, filed Aug. 25, 2021, the entirety of which is incorporated by reference herein.

BACKGROUND OF THE INVENTION

Field of the Invention

The present invention relates to a driving mechanism, and, in particular, to a driving mechanism that drives an optical element to move.

Description of the Related Art

As technology has advanced, a lot of electronic devices (for example, laptop computers and smartphones) have incorporated the functionality of taking photographs and recording video. These electronic devices have become more commonplace, and have been developed to be more convenient and thin. More and more options are provided for users to choose from.

It can be difficult to reduce the size of the shutter or aperture mechanism in the camera module of some electronic devices. Additionally, the movable mechanism inside these electronic devices may be damaged when the unit collides with external objects. Addressing these problems has become a challenge.

BRIEF SUMMARY OF THE INVENTION

An embodiment of the present invention provides a driving mechanism for moving an optical element, including a base, a movable unit, a movable part, a first driving assembly, and a second driving assembly. The movable unit is movably disposed on the base and connected to the optical element, wherein the movable unit has a first contact portion. The movable part is movably disposed on the base and has a first restricting portion. The first driving assembly is configured to force the movable part to move relative to the base between the first position and the second position. The second driving assembly is configured to force the movable unit to move relative to the base between a first limit position and the second limit position. When the movable unit is in its initial position, the first contact portion is engaged with the first restricting portion, thereby restricting the movable part in the first position.

In some embodiments, the first contact portion forms a protrusion, and the first restricting portion forms a recess.

In some embodiments, the movable unit further has a slider, and the movable part further has a longitudinal passage, wherein the first contact portion is formed on the slider, and when the movable part moves from the first position to the second position, the second driving assembly forces the slider to move through the passage.

In some embodiments, the movable unit further has a second contact portion that is formed on the slider, and the movable part further has a second restricting portion, wherein when the movable unit is located in a closed position relative to the base, the second contact portion is engaged with the second restricting portion, thereby restricting the movable part in the second position.

In some embodiments, the second contact portion forms a protrusion, and the second restricting portion forms a recess.

In some embodiments, the first and second contact portions are located on opposite sides of the slider.

In some embodiments, the second driving assembly is configured to impel the movable unit relative to the base in a horizontal direction, and the first and second contact portions are arranged in a direction that is angled relative to the horizontal direction.

In some embodiments, the first and second restricting portions are located on opposite sides of the movable part.

In some embodiments, the first and second restricting portions are arranged in a direction that is angled relative to the passage.

In some embodiments, when the second driving assembly forces the movable unit to move from the initial position to the first limit position, the first contact portion is released from the first restricting portion.

In some embodiments, when the movable unit is in the first limit position, the first driving assembly forces the movable part to rotate relative to the base from the first position to the second position so that the passage is aligned to the slider.

In some embodiments, when the passage is aligned to the slider, the second driving assembly forces the movable unit to move from the first limit position through the passage to the second limit position.

In some embodiments, when the movable unit is in the second limit position, the first driving assembly forces the movable part to rotate relative to the base from the second position back to the first position.

In some embodiments, when the movable part rotates from the second position back to the first position, the second driving assembly forces the movable unit to move from the second limit position to the closed position so that the second contact portion is engaged with the second restricting portion.

In some embodiments, the initial and closed positions are located between the first and second limit positions.

In some embodiments, the initial position is located between the closed position and the first limit position.

In some embodiments, the driving mechanism further includes a sheet yoke disposed in the base, and the second driving assembly is configured to impel the movable unit relative to the base in a horizontal direction, wherein when viewed in a vertical direction perpendicular to the horizontal direction, the sheet yoke and the first driving assembly at least partially overlap.

In some embodiments, the movable part comprises ferromagnetic or magnetic permeable material, and the first driving assembly has a coil and a yoke extending through the coil, wherein the sheet yoke and the movable part at least partially overlap when viewed in the vertical direction.

In some embodiments, the sheet yoke forms a slot parallel to the passage when the movable part is in the second position.

In some embodiments, the slider extends through the slot, and the slider does not contact the sheet yoke.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the driving mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In the following detailed description of the preferred embodiments, reference is made to the accompanying drawings, and in which specific embodiments of which the invention may be practiced are shown by way of illustration. In this regard, directional terminology, such as "top," "bottom," "left," "right," "front," "back," etc., is used with reference to the orientation of the figures being described. The components of the present invention can be positioned in a number of different orientations. As such, the directional terminology is used for the purposes of illustration and is in no way limiting.

Figure 1:
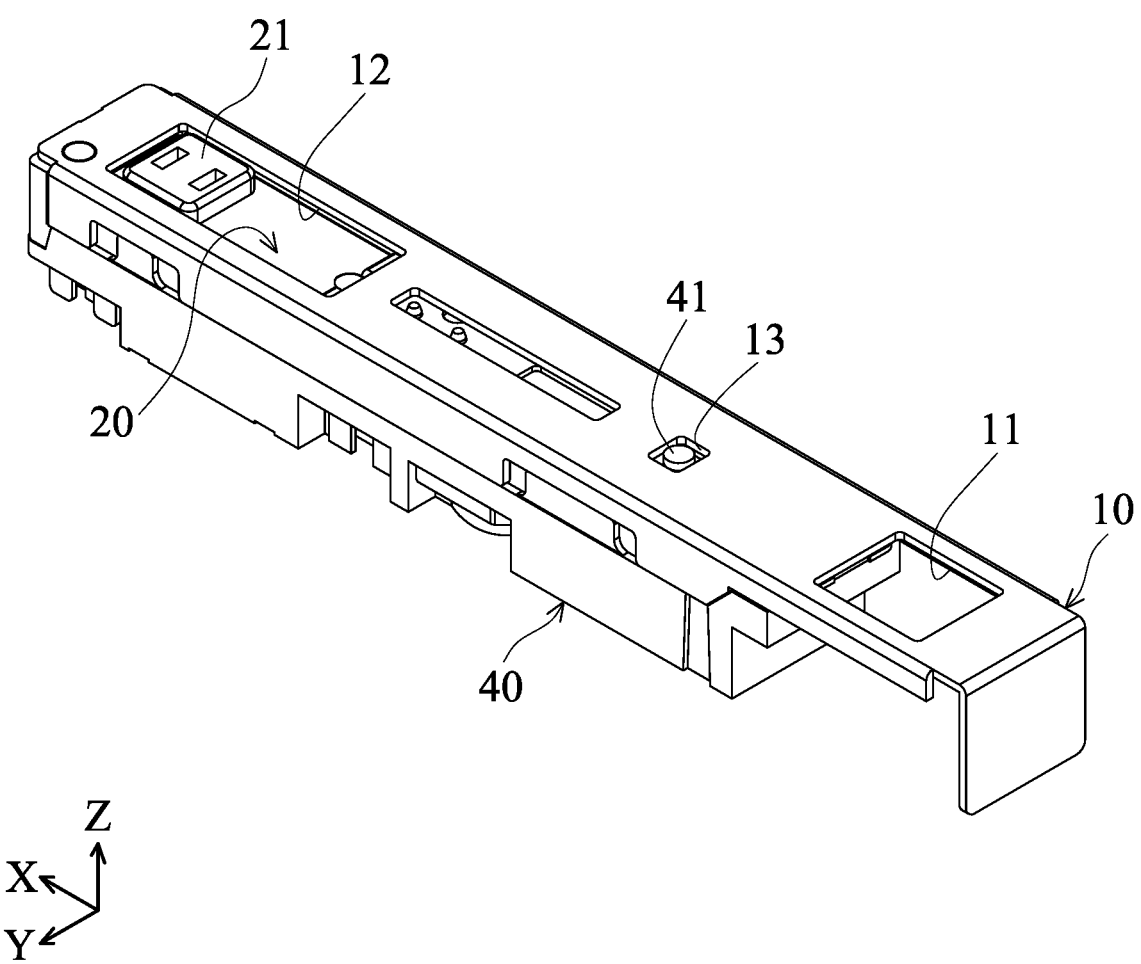
FIG. 1 is a perspective diagram of a driving mechanism 100, in accordance with an embodiment of the invention.
Figure 2:
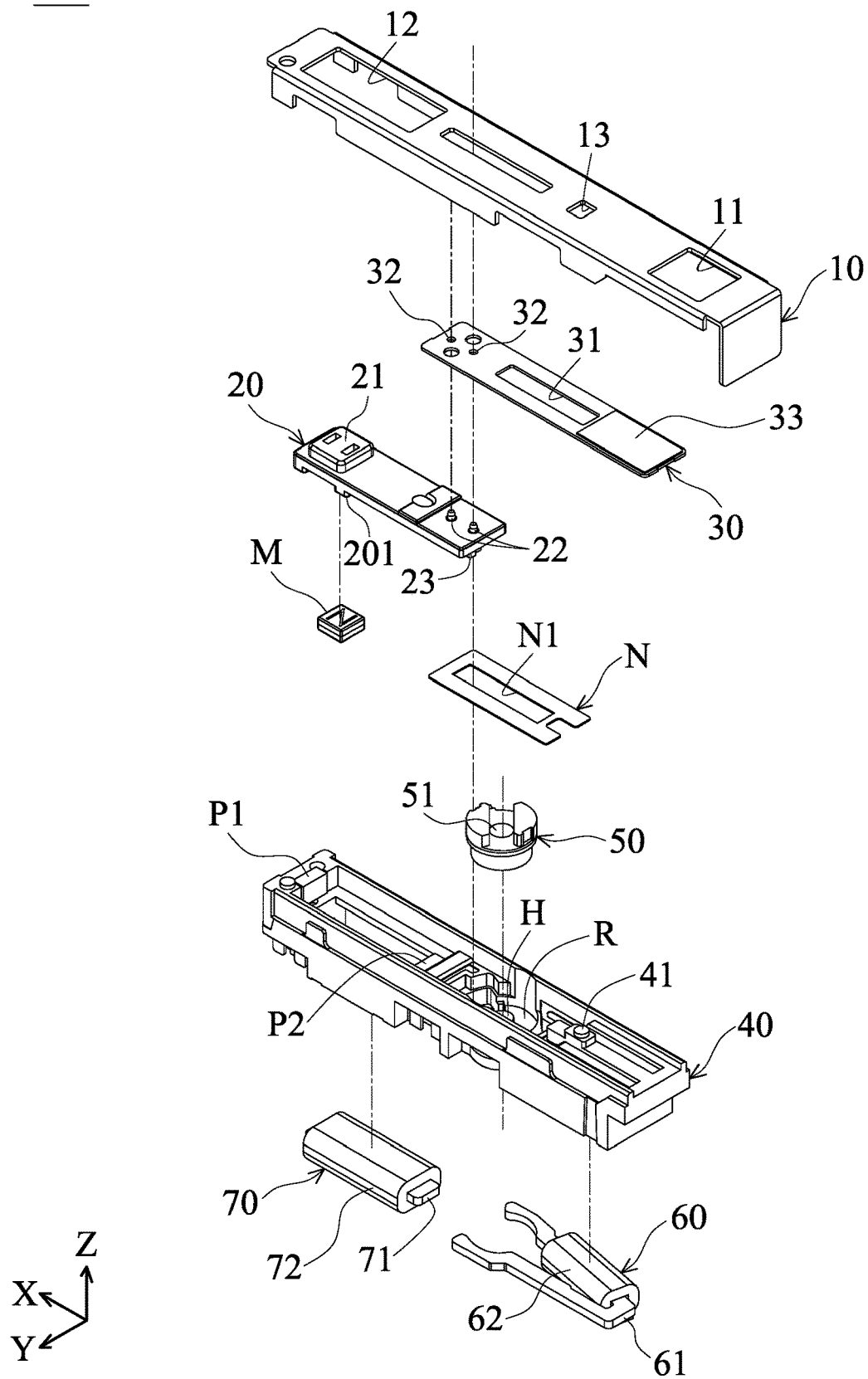
FIG. 2 is an exploded diagram of the driving mechanism 100 in FIG. 1 before assembly.
Figure 3:
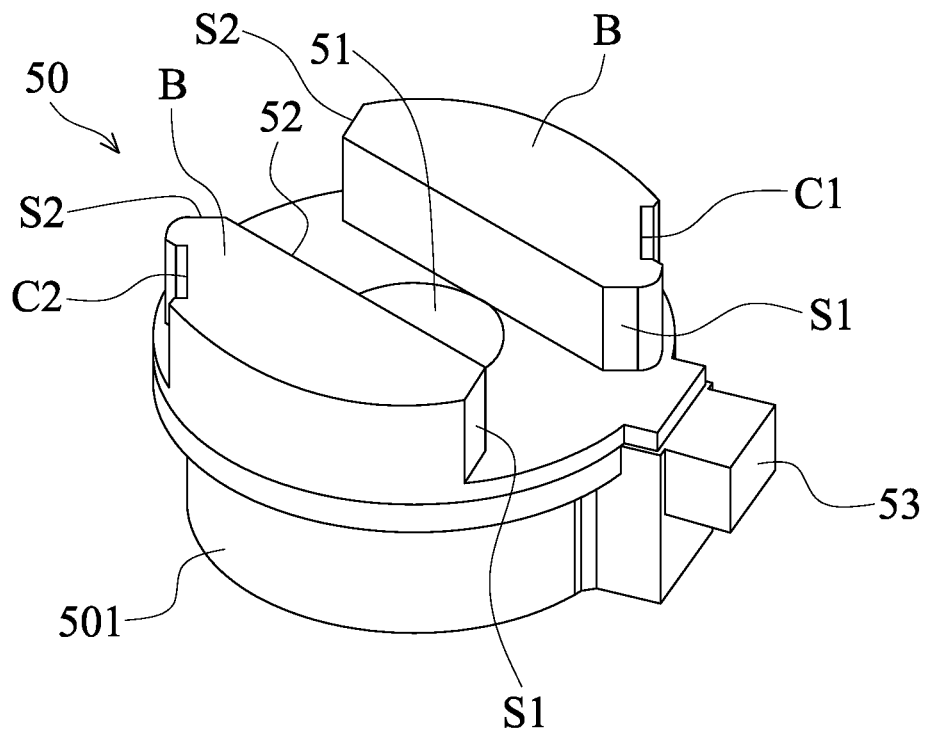
FIG. 3 is a perspective diagram of the movable part 50 in FIG. 2.
Figure 4:
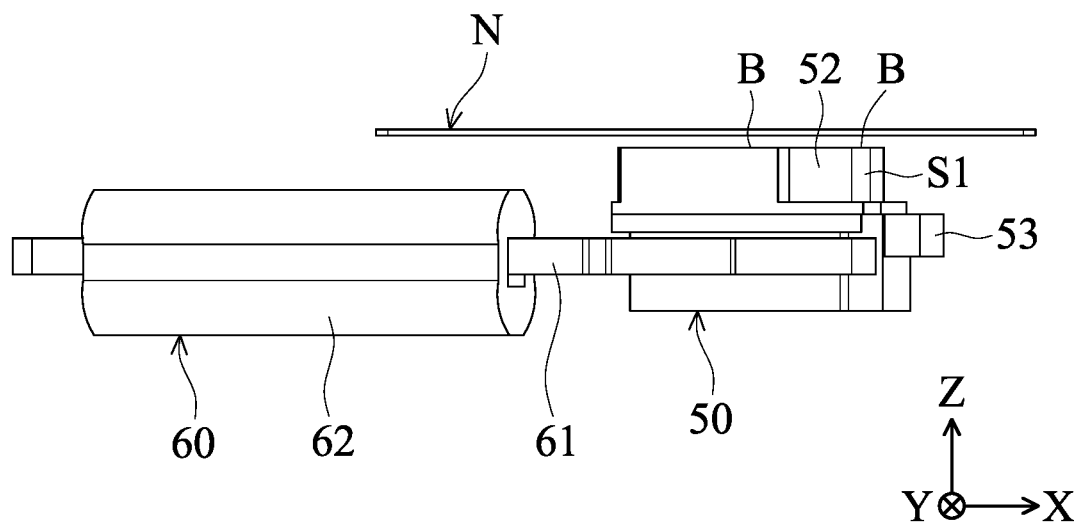
FIG. 4 is a side view of the movable part 50, the first driving assembly 60, and the sheet yoke N after assembly.
Figure 5:
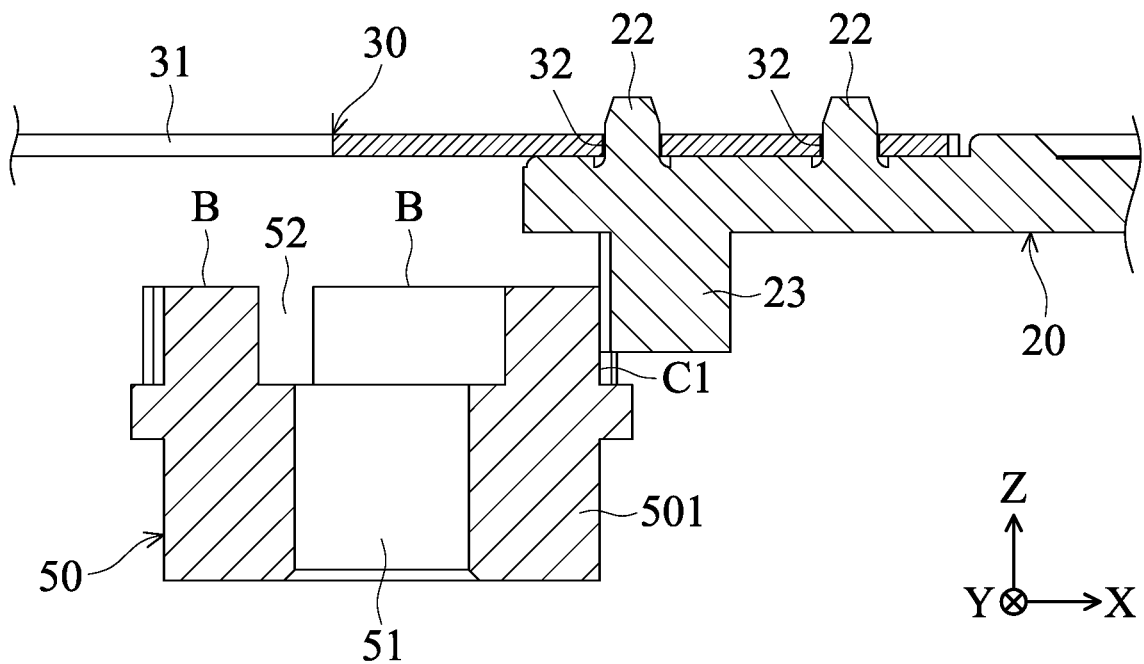
FIG. 5 is a cross-sectional view of the movable unit 20 and the optical element 30 when in the initial position.
Figure 6:
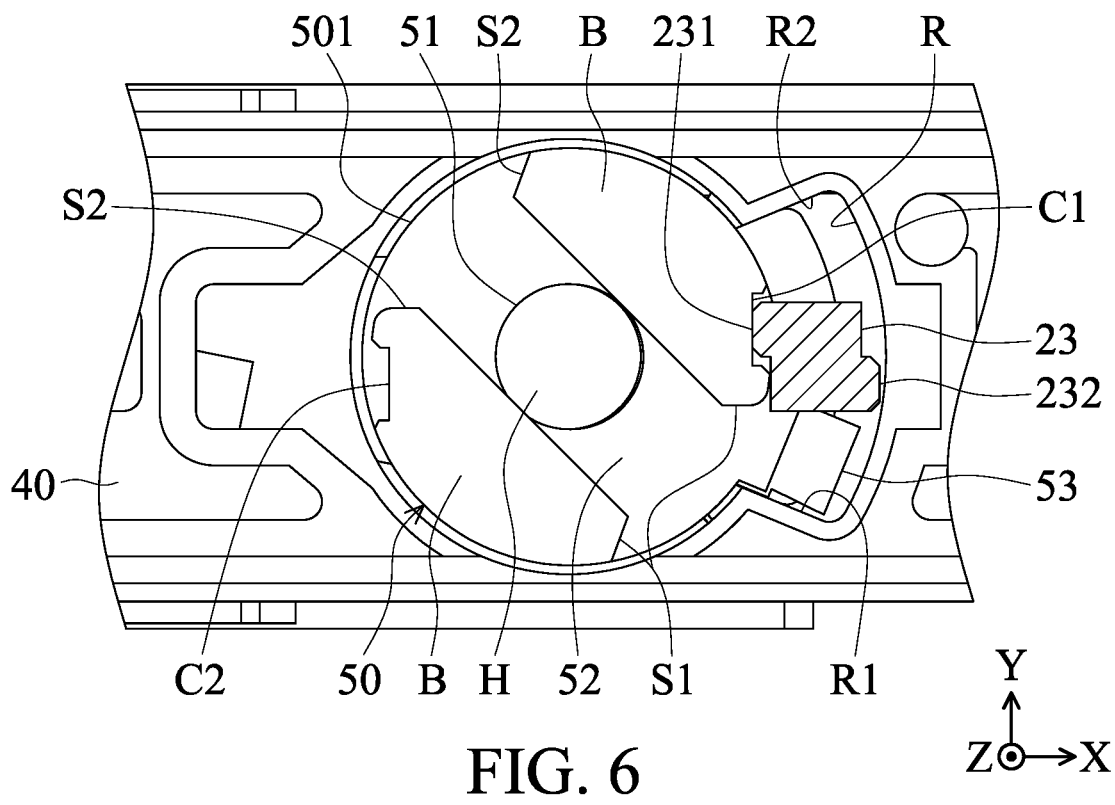
FIG. 6 is a schematic diagram showing the first contact portion 231 of the slider 23 joined with the first restricting portion C1 of the movable part 50.
Figure 7:
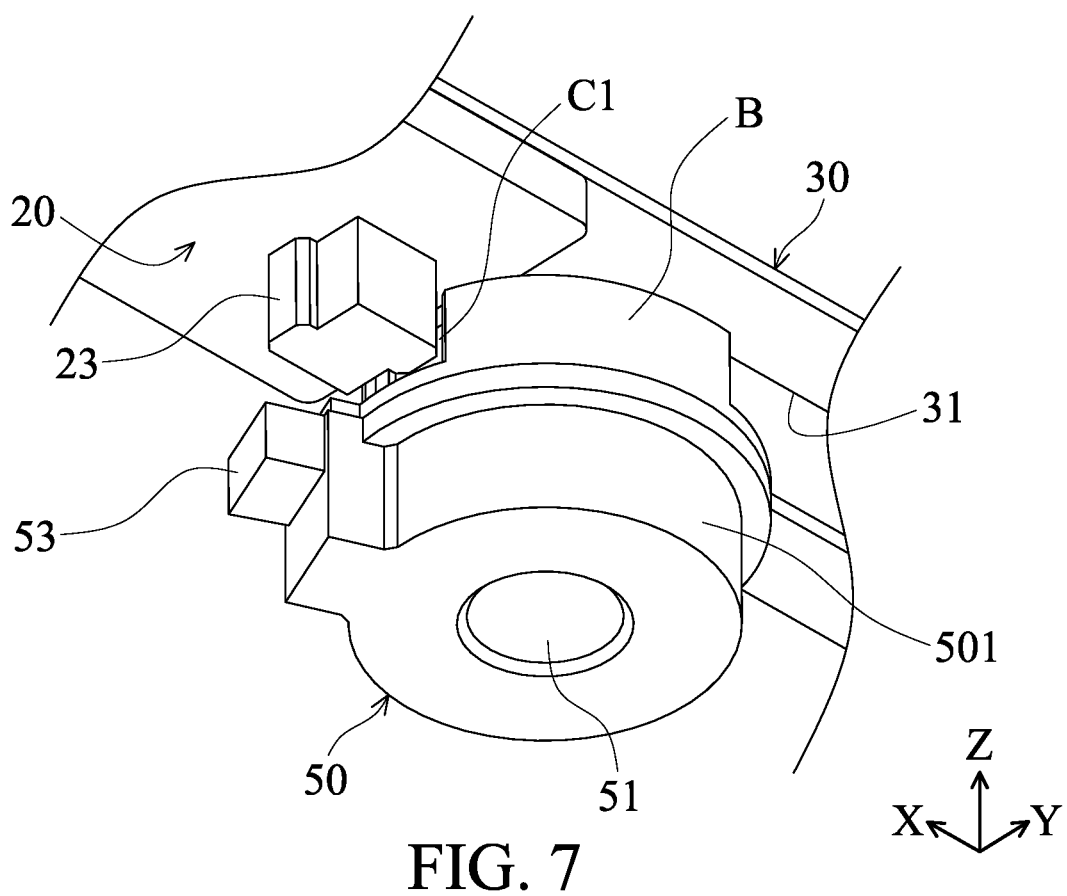
FIG. 7 is a perspective diagram showing the movable unit 20 and the optical element 30 when in the initial position.

FIG. 1 is a perspective diagram of a driving mechanism 100, in accordance with an embodiment of the invention. FIG. 2 is an exploded diagram of the driving mechanism 100 in FIG. 1 before assembly. FIG. 3 is a perspective diagram of the movable part 50 in FIG. 2. FIG. 4 is a side view of the movable part 50, the first driving assembly 60, and the sheet yoke N after assembly. FIG. 5 is a cross-sectional view of the movable unit 20 and the optical element 30 when in the initial position. FIG. 6 is a schematic diagram showing the first contact portion 231 of the slider 23 joined with the first restricting portion C1 of the movable part 50. FIG. 7 is a perspective diagram showing the movable unit 20 and the optical element 30 when in the initial position.

Referring to FIGS. 1-7, the driving mechanism 100 may be disposed in a cell phone, laptop computer, or other electronic devices. In this embodiment, the driving mechanism 100 primarily comprises a housing 10, a movable unit 20, an optical element 30, a base 40 affixed to the housing 10, a movable part 50, a first driving assembly 60, a second driving assembly 70, a magnet M, a sheet yoke N, a first buffer member P1, and a second buffer member P2.

It should be noted that the movable part 50 may comprise ferromagnetic or magnetic permeable material, and it is movably received in the base 40. Additionally, the first driving assembly 60 has a yoke 61 and a coil 62, and the second driving assembly 70 has a yoke 71 and a coil 72, wherein the yokes 61 and 71 extend through the coils 62 and 72.

In this embodiment, the first driving assembly 60 can generate a magnetic field to drive the movable part 50 to rotate relative to the base 40 between the first position and the second position. Similarly, the second driving assembly 70 can generate a magnetic field to drive the magnet M, the movable unit 20, and the optical element 30 to move relative to the base 40 between the first limit position and the second limit position along the X axis.

As shown in FIGS. 1 and 2, the housing 10 forms three openings 11, 12, and 13, and the movable unit 20 has a protrusion 21 and at least a joining portion 22. The optical element 30 has a slot 31, at least a hole 32, and a light-shading portion 33. Here, the movable unit 20 and the optical element 30 are connected to each other by the joining portions 22 joined in the holes 32.

The base 40 forms a nub 41 that penetrates the slot 31 and is joined in the opening 13 of the housing 10, whereby the housing 10 is affixed to the base 40. Additionally, the protrusion 21 of the movable unit 20 is received in the opening 12 of the housing 10 and exposed to the top side of the driving mechanism 100.

Figure 8:
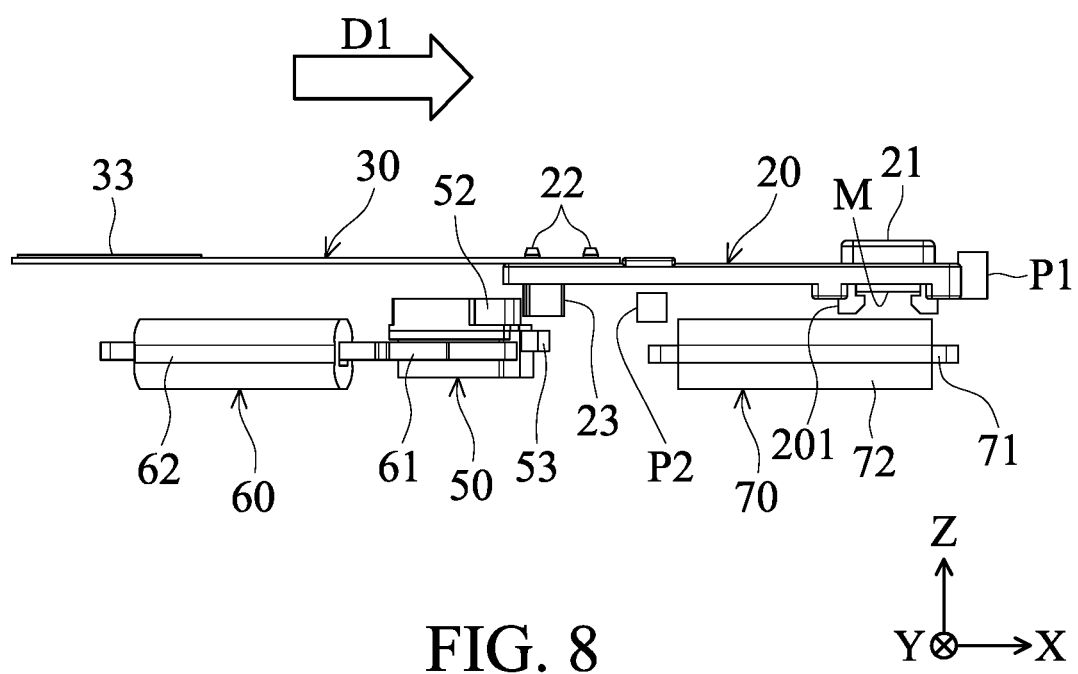
FIG. 8 is a side view of the movable unit 20 and the optical element 30 when moving relative to the base 40 from the initial position in the X direction to the first limit position.
Figure 9:
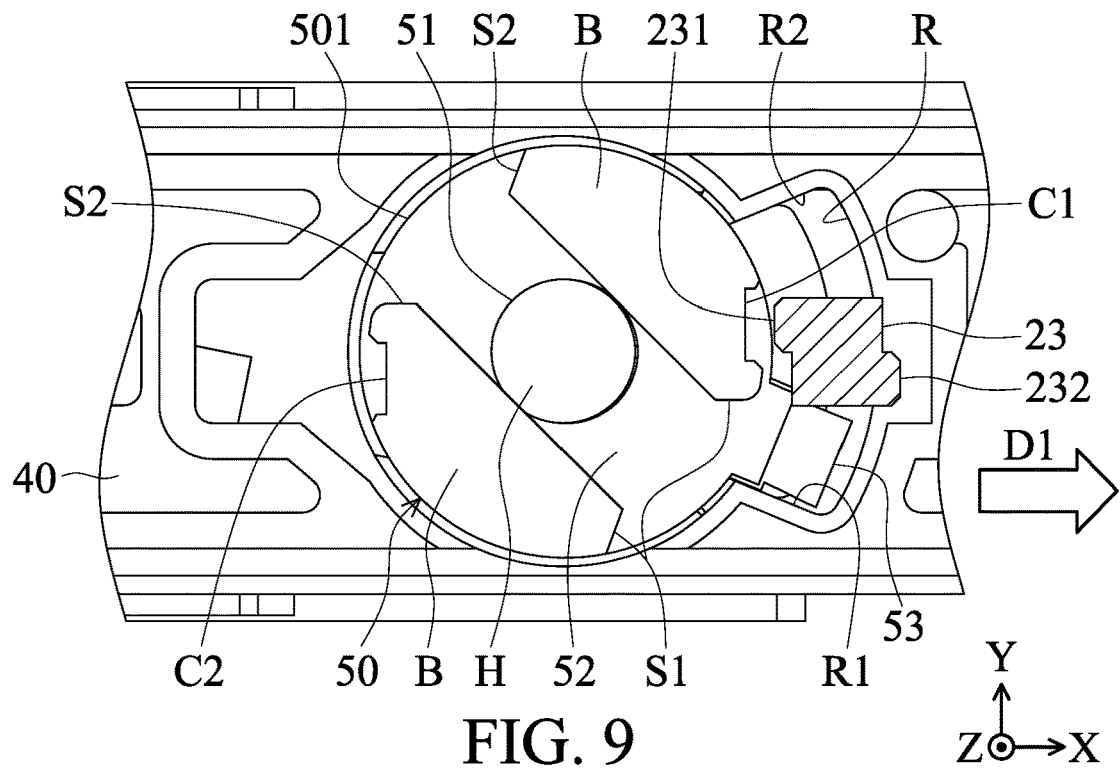
FIG. 9 is a schematic diagram showing the slider 23 of the movable unit 20 released from the first restricting portion C1 of the movable part 50.
Figure 13:
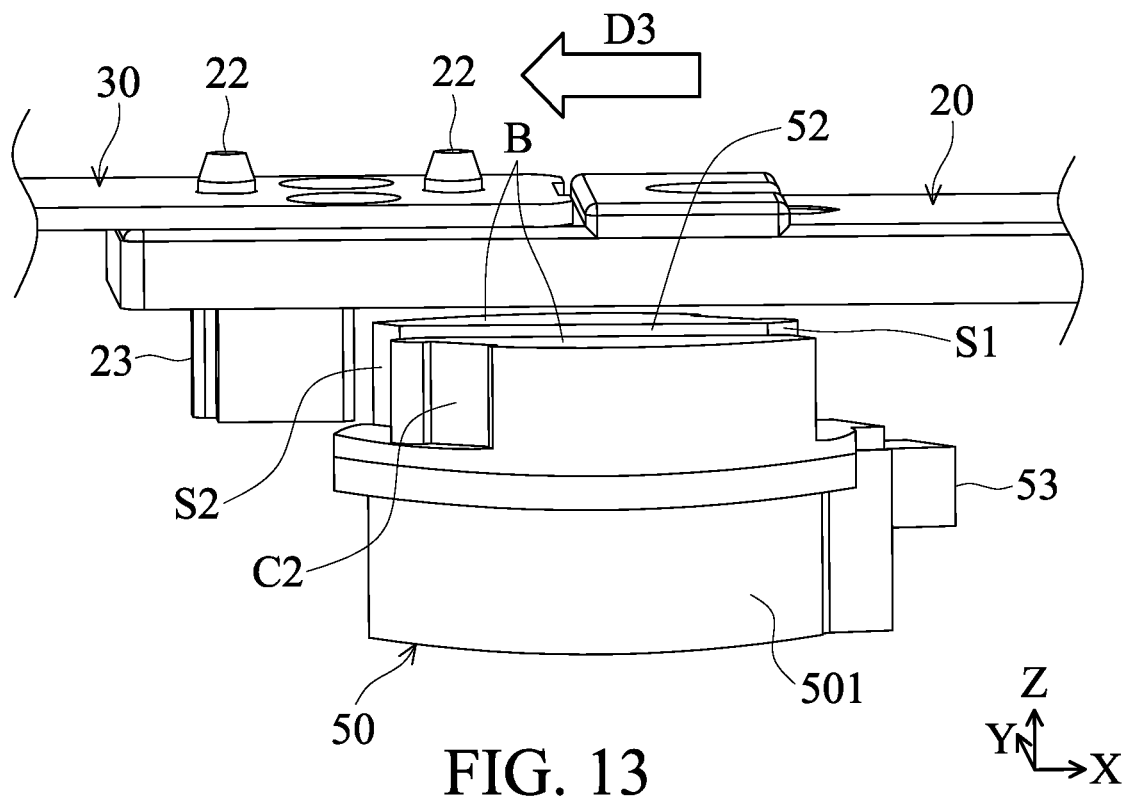
FIG. 13 is a perspective diagram of the movable unit 20 and the optical element 30 when moving relative to the base 40 from the first limit position in the X direction to the second limit position.
Figure 14:
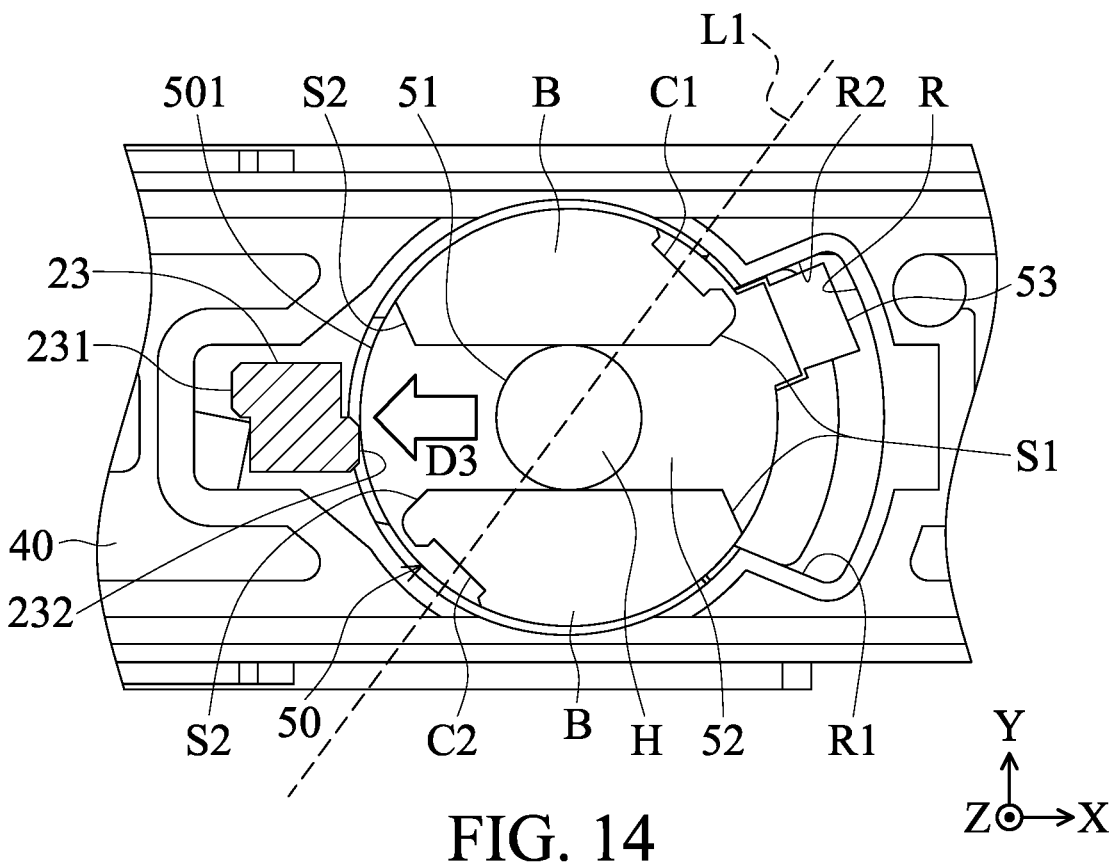
FIG. 14 is a schematic diagram showing the slider 23 of the movable unit 20 sliding through the passage 52 to the second limit position.

The first buffer member P1 and the second buffer member P2 are disposed in the base 40. When the movable unit 20 and the optical element 30 are in the first limit position relative to the base 40, as shown in FIGS. 8 and 9, one end of the movable unit 20 contacts the first buffer member P1. When the movable unit 20 and the optical element 30 move relative to the base 40 from the first limit position in the —X direction to the second limit position, as shown in FIGS. 13 and 14, the protrusion 201 (FIGS. 1 and 8) formed at the bottom of the movable unit 20 contacts the second buffer member P2, whereby serious collision between the movable unit 20 and the base 40 can be efficiently prevented.

Here, the optical element 30 may be used as a camera shutter blade. Since the light-shading portion 33 comprises light shading material, light can be prevented from entering the driving mechanism 100 through the opening 11 to an image sensor (not shown) in the electronic device.

Figure 17:
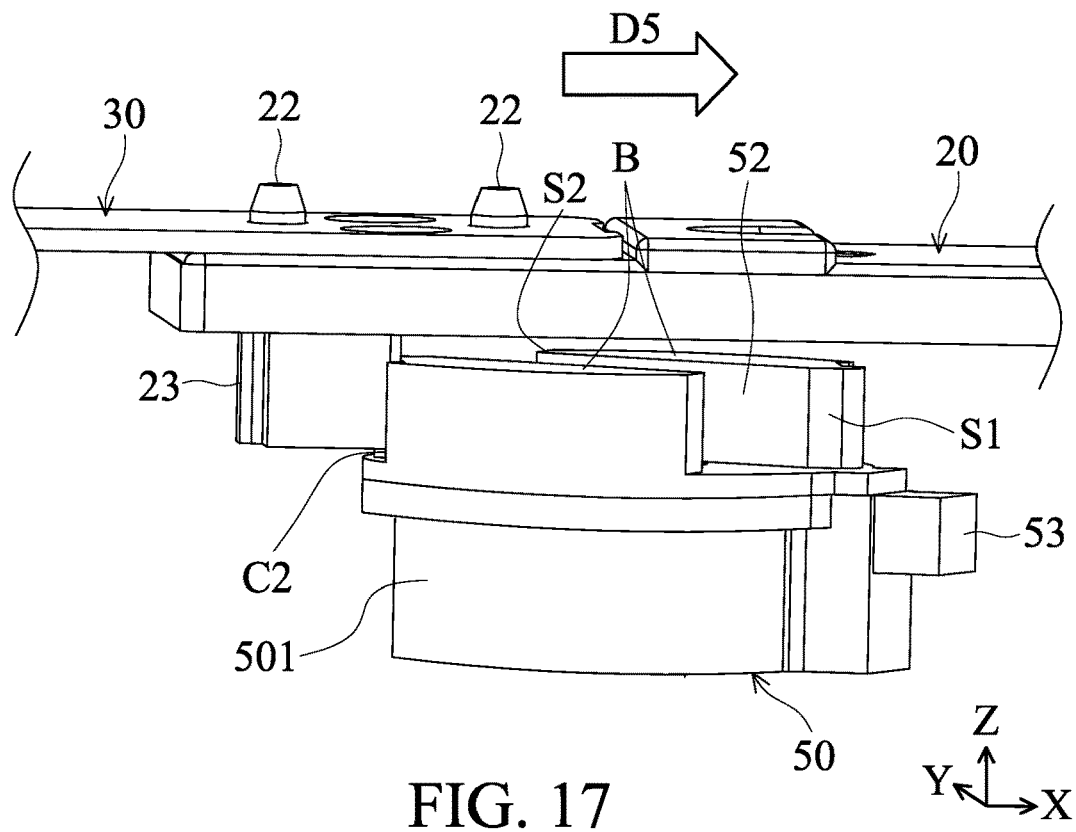
FIG. 17 is a perspective diagram of the movable unit 20 and the optical element 30 when moving relative to the base 40 from the second limit position in the X direction to the closed position.
Figure 18:
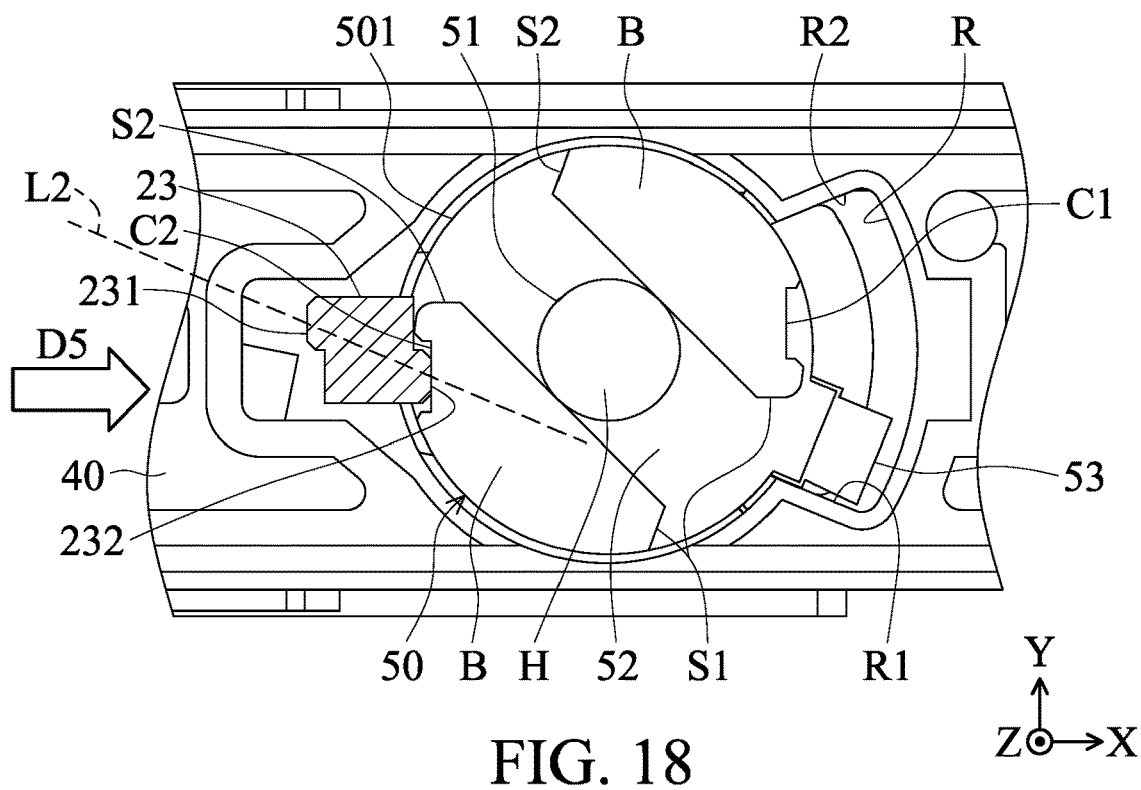
FIG. 18 is a schematic diagram showing the second contact portion 232 of the slider 23 is joined to second restricting portion C2 of the movable part 50.

As shown in FIGS. 5-7, when the movable unit 20 and the optical element 30 are in the initial position, light can enter the driving mechanism 100 via the opening 11 and then reach the image sensor in the electronic device. However, as shown in FIGS. 17 and 18, when the movable unit 20 and the optical element 30 move relative to the base 40 from the initial position to a closed position, the opening 11 of the housing 10 is blocked by the light-shading portion 33 of the optical element 30, thus preventing light from entering the driving mechanism 100 via the opening 11.

It can be seen in FIGS. 2, 5, 6, 7 that a slider 23 is formed on the bottom side of the movable unit 20, and the magnet M is affixed to the bottom side of the movable unit 20. Specifically, the first driving assembly 60 and the second driving assembly 70 are disposed at the bottom of the base 40. The first driving assembly 60 can generate a magnetic field to drive the movable part 50 to rotate relative to the base 40, and the second driving assembly 70 can generate a magnetic field to drive the magnet M, the movable unit 20, and the optical element 30 to move relative to the base 40 along the X axis (horizontal direction).

Still referring FIGS. 1-7, the movable part 50 has a main body 501, a hole 51, two blocks B, a passage 52, and a protrusion 53. The blocks B protrude from the main body 501 in a vertical direction (Z direction), the passage 52 is formed between the two blocks B, and the protrusion 53 protrudes from the main body 501 in a horizontal direction that is perpendicular to the Z axis.

During assembly, a hinge H of the base 40 is inserted into the hole 51 of the movable part 50, and the protrusion 53 is movably received in a fan-shaped recess R of the base 40. When the first driving assembly 60 generates a first magnetic field, the protrusion 53 abuts a first sidewall R1 of the fan-shaped recess R, and the movable part 50 is in a first position relative to the base 40. In this state, the passage 52 between the two blocks B is angled relative to a longitudinal axis (X axis) of the driving mechanism 100.

Meanwhile, a current signal can be applied to the coil 72 of the second driving assembly 70, so that the movable unit 20 and the optical element 30 are located in the initial position as shown in FIGS. 5-7, and a first contact portion 231 of the slider 23 is joined to a first restricting portion C1 of the movable part 50 (FIG. 6). Hence, the movable part 50 can be prevented from rotating relative to the base 40, whereby unintentional displacements and damages of the movable part 50, the movable unit 20, and the optical element 30 can be avoided when the driving mechanism 100 is collided with other objects.

In this embodiment, the first contact portion 231 forms a protrusion, and the first restricting portion C1 forms a recess.

It can also be seen in FIGS. 3 and 6 that each of the blocks B on the top side of the movable part 50 forms a first guiding surface S1 and a second guiding surface S2, wherein the first guiding surfaces S1 of the two blocks B form a first divergent structure toward the peripheral of the movable part 50. Similarly, the second guiding surfaces S2 of the two blocks B form a second divergent structure toward the peripheral of the movable part 50, wherein the first and second divergent structures are on opposite sides of the movable part 50. Thus, the slider 23 at the bottom of the movable unit 20 can be guided through the passage 52 smoothly, and serious collision between the movable unit 20 and the movable part 50 can be efficiently prevented.

As shown in FIG. 4, when viewed in the vertical direction (Z direction), the sheet yoke N and the movable part 50 at least partially overlap. Moreover, the sheet yoke N and the first driving assembly 60 (the yoke 61 and the coil 62) at least partially overlap, so as to enhance the magnetic field distribution and improve the efficiency of the first driving assembly 60.

FIG. 8 is a side view of the movable unit 20 and the optical element 30 when moving relative to the base 40 from the initial position in the X direction to the first limit position. FIG. 9 is a schematic diagram showing the slider 23 of the movable unit 20 released from the first restricting portion C1 of the movable part 50.

As indicated by the arrows D1 in FIGS. 8 and 9, when the coil 72 of the second driving assembly 70 is energized by a specific current signal, the magnet M, the movable unit 20, and the optical element 30 are forced to move in the X direction to the first limit position. In this state, the slider 23 of the movable unit 20 is released from the first restricting portion C1 of the movable part 50 and contacts the first buffer member P1, so that the movable part 50 can rotate relative to the base 40.

Figure 10:
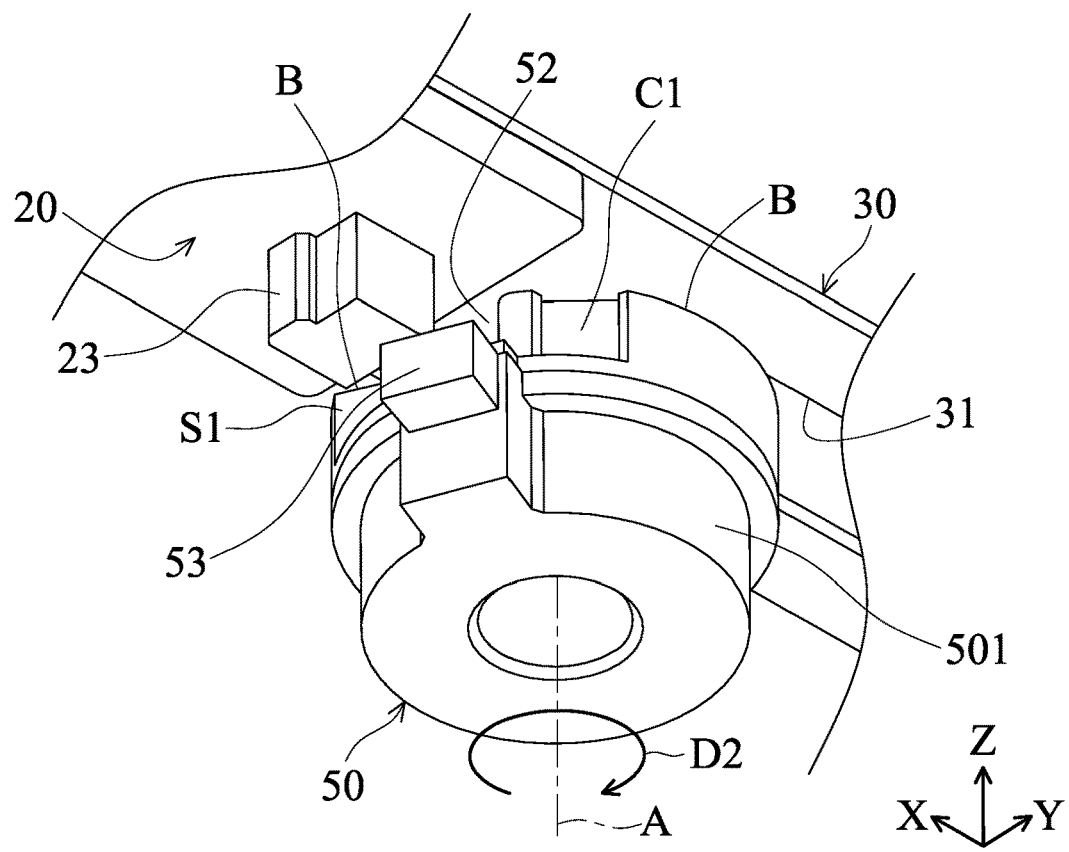
FIG. 10 is a perspective diagram of the movable part 50 when rotating from the first position to the second position.
Figure 11:
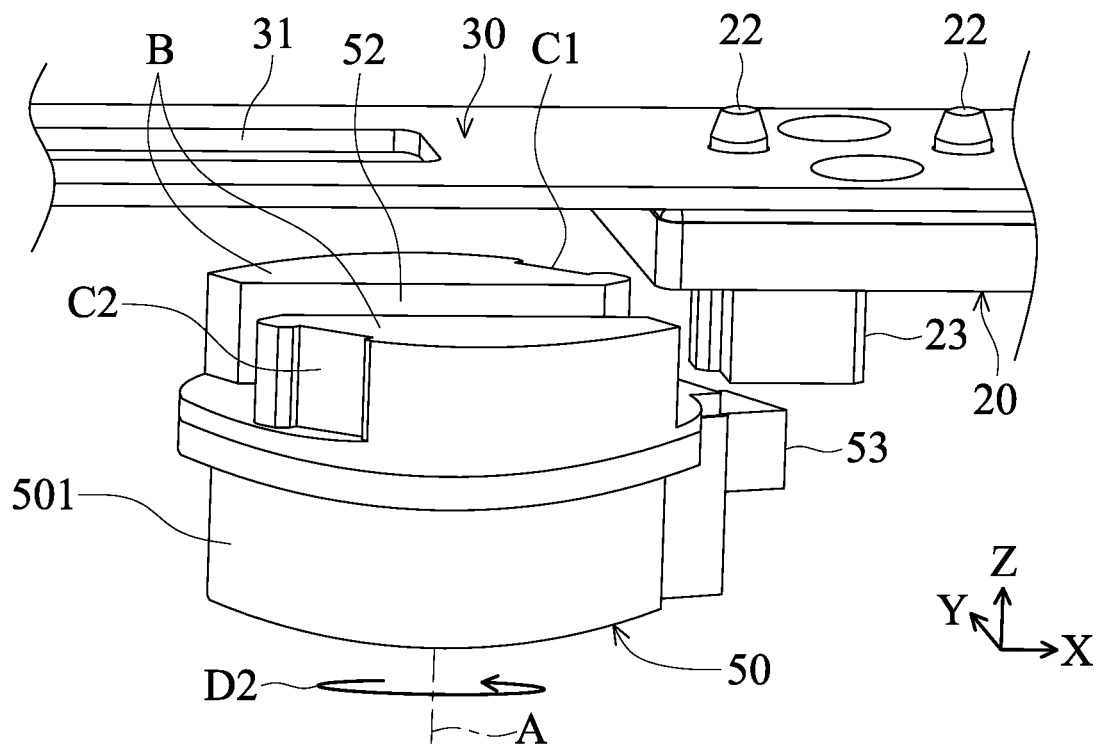
FIG. 11 is another perspective diagram of the movable part 50 when rotating from the first position to the second position.
Figure 12:
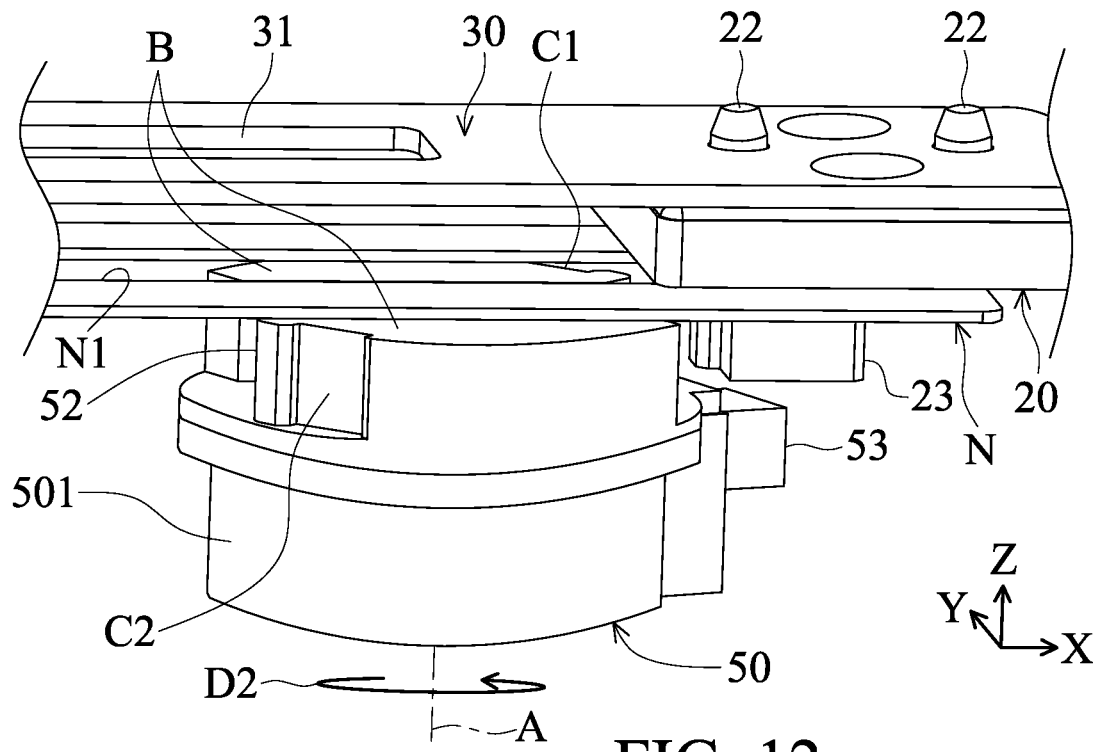
FIG. 12 is a perspective diagram showing the slot N1 of the sheet yoke N aligned to the passage 52 of the movable part 50.

FIG. 10 is a perspective diagram of the movable part 50 when rotating from the first position to the second position. FIG. 11 is another perspective diagram of the movable part 50 when rotating from the first position to the second position. FIG. 12 is a perspective diagram showing the slot N1 of the sheet yoke N aligned to the passage 52 of the movable part 50.

As indicated by the arrows D2 in FIGS. 10-12, after the movable unit 20 is released from the first restricting portion C1 of the movable part 50, the first driving assembly 60 can generate a second magnetic field to rotate the movable part 50 relative to the base 40 from the first position to the second position, whereby the passage 52 between the two blocks B is parallel to a longitudinal axis (X axis) of the driving mechanism 100 and aligned to the slot N1 of the sheet yoke N. It should be noted that the passage 52 is also aligned to the slider 23 at the bottom of the movable unit 20.

FIG. 13 is a perspective diagram of the movable unit 20 and the optical element 30 when moving relative to the base 40 from the first limit position in the −X direction to the second limit position. FIG. 14 is a schematic diagram showing the slider 23 of the movable unit 20 sliding through the passage 52 to the second limit position.

As indicated by the arrows D3 in FIGS. 13 and 14, to block the opening 11 of the housing 10 with the optical element 30, the coil 72 of the second driving assembly 70 can be energized by a specific current signal, whereby the magnet M, the movable unit 20, and the optical element 30 are forced to move from the first limit position (FIGS. 10-12) in the −X direction through the passage 52 to the second limit position.

It can be seen in FIG. 14 that the protrusion 53 of the movable part 50 abuts a second sidewall R2 of the fan-shaped recess R. Moreover, the movable part 50 has a second restricting portion C2 corresponding to a second contact portion 232 of the slider 23, wherein the first and second restricting portions C1 and C2 are arranged in a direction L1 that is angled relative to the passage 52.

Figure 15:
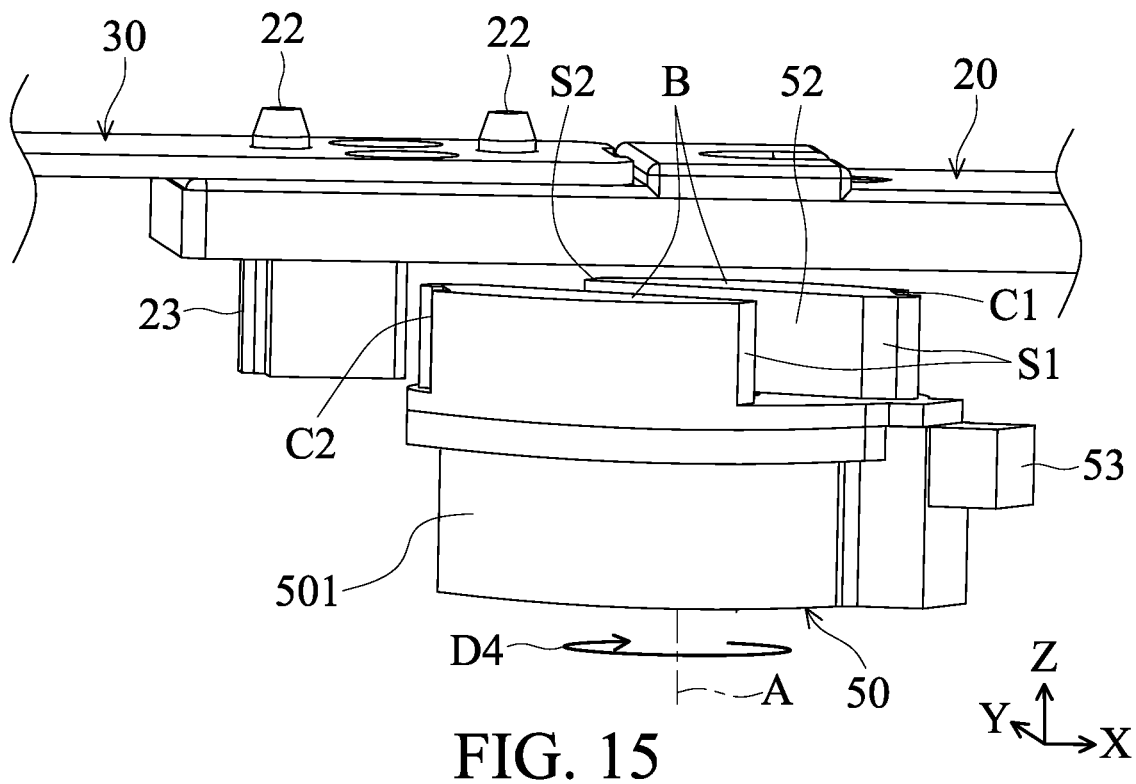
FIG. 15 is a perspective diagram of the movable part 50 when rotating from the second position back to the first position.
Figure 16:
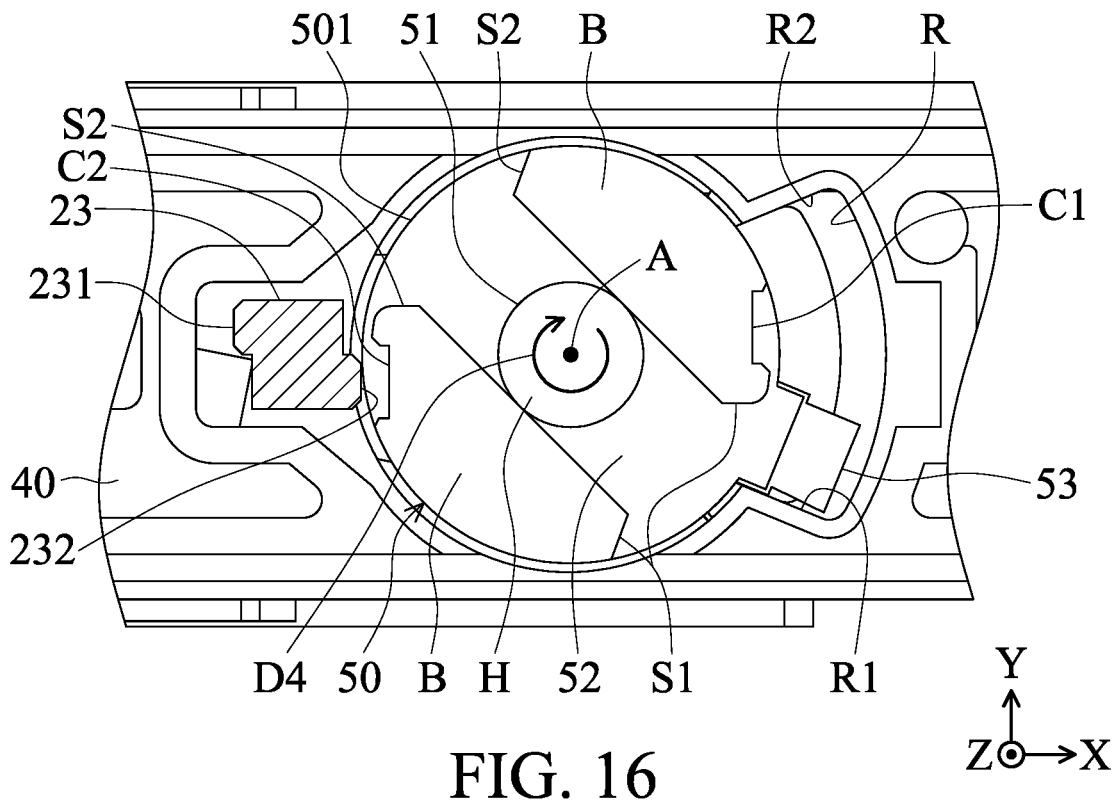
FIG. 16 is a schematic diagram of the movable part 50 when rotating from the second position back to the first position.

FIG. 15 is a perspective diagram of the movable part 50 when rotating from the second position back to the first position. FIG. 16 is a schematic diagram of the movable part 50 when rotating from the second position back to the first position.

As indicated by the arrows D4 in FIGS. 15 and 16, after the movable unit 20 and the optical element 30 move to the second limit position, the first driving assembly 60 can generate the first magnetic field again, thus impelling the movable part 50 to rotate from the second position back to the first position around the central axis A. In this state, the passage 52 between the two blocks B is angled relative to the longitudinal axis (X axis) of the driving mechanism 100, and the second contact portion 232 of the slider 23 faces the second restricting portion C2 of the movable part 50.

FIG. 17 is a perspective diagram of the movable unit 20 and the optical element 30 when moving relative to the base 40 from the second limit position in the X direction to the closed position. FIG. 18 is a schematic diagram showing the second contact portion 232 of the slider 23 joined to second restricting portion C2 of the movable part 50.

After the movable part 50 rotates relative to the base 40 from the second position (FIG. 14) back to the first position (FIG. 16), the coil 72 of the second driving assembly 70 can be energized by a specific current signal, whereby the magnet M, the movable unit 20, and the optical element 30 are forced to move in the X direction, as indicated by the arrows D5 in FIGS. 17 and 18, so that the second contact portion 232 of the slider 23 is joined to second restricting portion C2 of the movable part 50. In this state, the opening 11 of the housing 10 can be blocked by the light-shading portion 33 of the optical element 30, thus preventing light from entering the driving mechanism 100 via the opening 11.

With the second contact portion 232 of the slider 23 joined to second restricting portion C2 of the movable part 50, the movable unit 20 and the optical element 30 can be prevented from moving in the X direction relative to the base 40, and the movable part 50 can also be prevented from rotating relative to the base 40. Thus, unintentional displacements and damages of the movable part 50, the movable unit 20, and the optical element 30 can be avoided when the driving mechanism 100 is collided with other objects.

It can be seen in FIG. 18 that the first and second contact portions 231 and 232 are located on opposite sides of the slider 23, and the first and second restricting portions C1 and C2 are located on opposite sides of the movable part 50. In this embodiment, the second contact portion 232 forms a protrusion, and the second restricting portion C2 forms a recess.

Specifically, the first and second contact portions 231 and 232 are arranged in a direction L2 that is angled relative to the moving direction (X axis) of the movable unit 20. Moreover, as disclosed in FIGS. 5-18, it could be realized that the initial and closed positions are located between the first and second limit positions, and the initial position is located between the closed position and the first limit position.

In summary, the invention provides a driving mechanism 100 that has a movable unit 20 and a movable part 50. The movable unit 20 has a first contact portion 231 and a second contact portion 232, and the movable part 50 has a first restricting portion C1 and a second restricting portion C2. When the movable unit 20 is in the initial position, the first contact portion 231 of the movable unit 20 is engaged with the first restricting portion C1 of the movable part 50. Moreover, when the movable unit 20 is in the closed position, the second contact portion 232 of the movable unit 20 is engaged with the second restricting portion C2 of the movable part 50, whereby the movable part 50 can also be prevented from rotating relative to the base 40.

As a result, unintentional displacements and damages of the movable part 50, the movable unit 20, and the optical element 30 can be avoided when the driving mechanism 100 is collided with other objects, and miniaturization of the driving mechanism 100 can be also achieved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A driving mechanism for moving an optical element, comprising:
   a base;
   a movable unit, movably disposed on the base and connected to the optical element, wherein the movable unit has a first contact portion;
   a movable part, movably disposed on the base and having a first restricting portion;
   a first driving assembly, configured to force the movable part to move relative to the base between a first position and a second position; and
   a second driving assembly, configured to force the movable unit to move relative to the base between a first limit position and a second limit position; and
   a sheet yoke disposed in the base, wherein the second driving assembly is configured to impel the movable unit relative to the base in a horizontal direction, wherein when viewed in a vertical direction perpendicular to the horizontal direction, the sheet yoke and the first driving assembly at least partially overlap;

wherein when the movable unit is in an initial position, the first contact portion is engaged with the first restricting portion, thereby restricting the movable part in the first position;

wherein the movable unit further has a slider, and the movable part further has a longitudinal passage, wherein the first contact portion is formed on the slider, and when the movable part moves from the first position to the second position, the second driving assembly forces the slider to move through the passage.

2. The driving mechanism as claimed in claim 1, wherein the first contact portion forms a protrusion, and the first restricting portion forms a recess.

3. The driving mechanism as claimed in claim 1, wherein the movable unit further has a second contact portion that is formed on the slider, and the movable part further has a second restricting portion, wherein when the movable unit is located in a closed position relative to the base, the second contact portion is engaged with the second restricting portion, thereby restricting the movable part in the second position.

4. The driving mechanism as claimed in claim 3, wherein the second contact portion forms a protrusion, and the second restricting portion forms a recess.

5. The driving mechanism as claimed in claim 3, wherein the first and second contact portions are located on opposite sides of the slider.

6. The driving mechanism as claimed in claim 5, wherein the first and second contact portions are arranged in a direction that is angled relative to the horizontal direction.

7. The driving mechanism as claimed in claim 3, wherein the first and second restricting portions are located on opposite sides of the movable part.

8. The driving mechanism as claimed in claim 7, wherein the first and second restricting portions are arranged in a direction that is angled relative to the passage.

9. The driving mechanism as claimed in claim 3, wherein when the second driving assembly forces the movable unit to move from the initial position to the first limit position, the first contact portion is released from the first restricting portion.

10. The driving mechanism as claimed in claim 9, wherein when the movable unit is in the first limit position, the first driving assembly forces the movable part to rotate relative to the base from the first position to the second position so that the passage is aligned to the slider.

11. The driving mechanism as claimed in claim 10, wherein when the passage is aligned to the slider, the second driving assembly forces the movable unit to move from the first limit position through the passage to the second limit position.

12. The driving mechanism as claimed in claim 11, wherein when the movable unit is in the second limit position, the first driving assembly forces the movable part to rotate relative to the base from the second position back to the first position.

13. The driving mechanism as claimed in claim 12, wherein when the movable part rotates from the second position back to the first position, the second driving assembly forces the movable unit to move from the second limit position to the closed position so that the second contact portion is engaged with the second restricting portion.

14. The driving mechanism as claimed in claim 3, wherein the initial and closed positions are located between the first and second limit positions.

15. The driving mechanism as claimed in claim 14, wherein the initial position is located between the closed position and the first limit position.

16. The driving mechanism as claimed in claim 1, wherein the movable part comprises ferromagnetic or magnetic permeable material, and the first driving assembly has a coil and a yoke extending through the coil, wherein the sheet yoke and the movable part at least partially overlap when viewed in the vertical direction.

17. The driving mechanism as claimed in claim 1, wherein the sheet yoke forms a slot parallel to the passage when the movable part is in the second position.

18. The driving mechanism as claimed in claim 17, wherein the slider extends through the slot, and the slider does not contact the sheet yoke.

* * * * *